(12) United States Patent
Salat et al.

(10) Patent No.: US 9,693,480 B2
(45) Date of Patent: Jun. 27, 2017

(54) ELECTRONIC DEVICE WITH COOLING BY A LIQUID METAL SPREADER

(71) Applicants: LABINAL POWER SYSTEMS, Blagnac (FR); INSTITUT POLYTECHNIQUE DE GRENOBLE, Grenoble (FR); CENTRE NATIONAL DE LA RECHERCHE SCIENTIFIQUE, Paris (FR)

(72) Inventors: Jacques Salat, Brie Comte Robert (FR); Yvan Avenas, Poisat (FR); Regis Bernard Albert Meuret, La Rochette (FR); Mansour Tawk, Grenoble (FR)

(73) Assignees: LABINAL POWER SYSTEMS, Blagnac (FR); Institut Polytechnic de Grenoble, Grenoble (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 230 days.

(21) Appl. No.: 14/365,538

(22) PCT Filed: Dec. 11, 2012

(86) PCT No.: PCT/FR2012/052873
§ 371 (c)(1),
(2) Date: Jun. 13, 2014

(87) PCT Pub. No.: WO2013/088054
PCT Pub. Date: Jun. 20, 2013

(65) Prior Publication Data
US 2015/0289410 A1    Oct. 8, 2015

(30) Foreign Application Priority Data
Dec. 13, 2011    (FR) ...................................... 11 61543

(51) Int. Cl.
*H05K 7/20* (2006.01)
*H01L 23/473* (2006.01)

(52) U.S. Cl.
CPC ....... *H05K 7/20263* (2013.01); *H01L 23/473* (2013.01); *H05K 7/20272* (2013.01); *H01L 2924/0002* (2013.01)

(58) Field of Classification Search
CPC ........... H01L 23/473; H01L 2023/4037; H01L 23/373; H05K 1/0272; H05K 7/20263;
(Continued)

(56) References Cited

U.S. PATENT DOCUMENTS

| 6,708,501 | B1 * | 3/2004 | Ghoshal ................ H01L 23/473 165/104.19 |
| 7,131,286 | B2 * | 11/2006 | Ghoshal ................ H01L 23/473 257/E23.098 |

(Continued)

OTHER PUBLICATIONS

International Search Report issued on Mar. 26, 2013 in PCT/FR12/052873, filed Dec. 11, 2012.
(Continued)

*Primary Examiner* — Robert J Hoffberg
*Assistant Examiner* — Hung Dang
(74) *Attorney, Agent, or Firm* — Oblon, McClelland, Maier & Neustadt, L.L.P.

(57) ABSTRACT

An electronic device with cooling of a heat dissipation source, by a liquid metals spreader, the device including at least one heat dissipation source, at least one spreader through which at least one liquid metal circulation channel passes forming a loop routed below a heat dissipation source, at least one heat sink, and at least one electromagnetic pump moving the liquid metal in the at least one channel such that the liquid metal absorbs heat dissipated by a heat dissipation source and transports the absorbed heat to be evacuated by the heat sink. Each spreader includes at (Continued)

least two plates made of an electrical insulating material located on each side of at least one bar made of deformable material.

16 Claims, 9 Drawing Sheets

(58) Field of Classification Search
CPC ....... H05K 7/20272; F28D 15/00; G06F 1/20; G06F 1/206; F28F 2250/08; H01S 5/02423
See application file for complete search history.

(56) References Cited

U.S. PATENT DOCUMENTS

| | | | |
|---|---|---|---|
| 8,003,370 B2* | 8/2011 | Maltezos | B01L 3/50851 435/283.1 |
| 8,730,674 B2* | 5/2014 | Dede | F25B 21/00 165/80.4 |
| 2006/0158849 A1 | 7/2006 | Martin et al. | |
| 2007/0215338 A1 | 9/2007 | Martin et al. | |
| 2010/0066178 A1 | 3/2010 | Lower et al. | |
| 2011/0180238 A1 | 7/2011 | Vetrovec | |

OTHER PUBLICATIONS

French Search Report issued Aug. 8, 2012 in FR 11 61543 filed Dec. 13, 2011.

\* cited by examiner

ELECTRONIC DEVICE WITH COOLING BY A LIQUID METAL SPREADER

TECHNICAL FIELD

This invention relates to an electronic device, for example a semiconductor device, cooled by liquid metals spreader.

STATE OF PRIOR ART

The field of the invention is temperature management of electronic components, for example semiconductors. As shown in FIG. 1, an electronic component may be placed on a cooling device through a metal plate a few millimetres thick. The purpose of this plate is to spread the emitted heat flux and thus increase the cross-section of this heat flux as experienced by the cooling device. Global thermal management is very much improved since temperature gradients are inversely proportional to the exchange area. The term "spreader" is used to denote such a plate throughout the remainder of this description. FIG. 1 shows a dissipation source 10, for example an electronic component or a packaged set of components, arranged on a spreader 11, that spreads the flux before it reaches the cooling device 12 (the arrows show the direction of the heat flux density $\phi$). The thickness of such a spreader is optimal; below this thickness, spreading is insufficient which degrades the performances of the cooling device. Above this thickness, the temperature resistance added by it becomes too high. If it is to be efficient, the spreader must remain a very good heat conductor, for example it can be made of copper. However, copper is heavy and this is why aluminium is also frequently used. Furthermore, the thermal conductivity of copper is limited (400 $W \cdot m^{-1} \cdot K^{-1}$. Thus, a large increase in the area of a spreader does not reduce the global thermal resistance because the heat flux will not reach the ends of the spreader.

Therefore, to improve global temperature management, it is useful to use materials with a higher equivalent thermal conductivity. One solution consists of using materials that are very good heat conductors such as materials charged with particles with high thermal conductivity (diamond, carbon, etc.). But at the present time, such materials are not sufficiently mature to be integrated into equipment and costs and performances are incompatible with industrial requirements (reliability, machining, conductivity obtained, mass). Another frequently envisaged solution is to use heat ducts.

As shown in FIG. 2, a heat duct 15 is composed of a closed containment 16, the inner walls of which are covered by a capillary network 17 saturated with liquid 18. It is usually composed of three parts called the evaporator 20, condenser 21 and adiabatic zone 22. At the evaporator 20, the liquid 18 is transformed into vapour 23 that is routed towards the condenser 21. After condensation, liquid is brought back to the evaporator through a capillary network 17 that drives the heat duct. With an appropriate capillary network, the heat duct 15 can operate in all positions and consequently without gravity. The essential advantage of the heat duct principle is that it generates a very low temperature difference between the evaporation zone 20 (heat source) and the condensation zone 21 (cooling source). The heat duct acts as a "thermal short circuit". Since the vapour zone of the heat ducts has very high equivalent thermal conductivity, they can be used as spreaders. FIG. 3 shows operation of such a heat duct 27 used as a heat spreader. The term heat spreader or "vapour chamber" is then used. The operating principle is the same as for conventional heat ducts but fluid paths are different because the heat source 25 (evaporator) is placed on a first face of the heat duct and the cooling source 26 (condenser) uses the entire second face.

Two-phase fluid type solutions (heat duct, vapour chamber) have limitations. For example, in aeronautical applications, the most restrictive limitations include the choice of the fluid, resistance to accelerations, performances for very high densities. The fluid used must be compatible with aeronautical constraints (fire constraint, European Reach regulation, etc.). Furthermore, the performance of these solutions is very dependent on the characteristics of the cooling source and the two-phase fluid used.

At the present time, there are examples of cooling loops for electronic systems making use of conducting fluids (molten salts or liquid metals) moved by direct current (DC) magnetohydrodynamic type electromagnetic pumps. A cooling loop defined in document reference [1] at the end of the description thus uses a magnetohydrodynamic conducting pump (MHD DC) for a GaIn (Gallium-Indium) type conducting fluid in order to cool an electronic component. The pump generates a pressure of the order of 25 kPa with a flow of 0.14 litre.min$^{-1}$, while the magnetic field applied to the pump is 0.9 T. This system is capable of cooling a heat flux density of more than 200 $W \cdot cm^{-2}$. In such a loop:

- The melting point of Gallium-Indium is higher than 0° C., which causes an operating problem at ambient temperatures below the melting temperature. Since the cooling source is far from the electronic component, it becomes impossible to start up the device before the component has warmed up.
- The power supply to the electromagnetic pump (high current/low voltage) is complex and its efficiency is low.
- Such a loop operating with a liquid metal or molten salt has good heat performances. Nevertheless, it is limited to particular applications because conducting fluids are very expensive (1000 Euros/kg) and the density of some liquid metals such as gallium or gallium alloys is six times higher than water.

Document reference [2] discloses a spreader in which a liquid metal, for example gallium or a gallium alloy such as Gallium-Indium-Tin, is put into circulation in channels machined in the spreader, below one or several semiconductor components. This liquid metal absorbs the heat under the semiconductor component(s) and distributes this heat over the entire remaining surface. This liquid metal is moved by means of a magnetohydrodynamic conducting pump integrated into the spreader. Deposition of a protective material isolates the channel walls and the liquid metal to prevent chemical interactions between them. Such a spreader has the following disadvantages; it requires a chemical coating to isolate the channel walls from the liquid metal. There is no remedy provided against the expansion of gallium when it solidifies; such expansion can damage the spreader.

The purpose of the invention is to overcome these disadvantages by disclosing the circulation of a liquid metal in a spreader made from a stack of several plates chemically compatible with gallium, the liquid metal absorbing heat under the heat source with low temperature rises and distributing this heat over the entire remaining surface of the spreader, while a heat sink integrated into the face below the spreader evacuates heat from the liquid metal.

PRESENTATION OF THE INVENTION

The invention relates to an electronic device with cooling of a heat dissipation source by a liquid metal spreader, this device comprising at least one heat dissipation source comprising at least one electronic component, at least one spreader through which at least one liquid metal circulation channel passes forming a loop routed below a heat dissipation source, at least one heat sink and at least one electromagnetic pump moving the liquid metal in said at least one channel such that the liquid metal absorbs heat dissipated by a heat dissipation source and transports it to be evacuated by a heat sink, characterised in that each spreader comprises at least two plates made of an insulating electrical material located on each side of at least one bar made of deformable material, around which a liquid metal circulation channel is made.

Advantageously, the at least one electronic component may be a semiconductor component. The liquid metal may be chosen from among gallium, indium, bismuth, tin, alloys including gallium and/or indium and/or tin, sodium-potassium alloy. Advantageously, each bar made of deformable material is made from expanded Teflon, foam with closed cells, foam with open cells and with sealed coating, or solid or hollow deformable plastic. Electrodes are made of molybdenum, tungsten, stainless steel or copper coated with a protective coating. This latter solution reduces the drop in global voltage and therefore the efficiency of the electromagnetic pump. The heat sink is a finned heat sink that may or may not be used with a fan, or a forced convection liquid cooler. Each electromagnetic pump may be a magnetohydrodynamic conducting pump ((MHD DC). It may be included between the two plates made of an electrical insulating material of a spreader. These plates made of an insulating electrical material may be made of ceramic, AlN, Al2O3, $Si_3N_4$ or SiC.

Advantageously, the spreader comprises fins inside the at least one liquid metal circulation channel to increase the exchange area with the liquid metal.

Advantageously, the device according to the invention comprises an electromagnetic pump+a stack of several semiconductor/liquid metals spreader/heat sink components.

Advantageously a heat duct is arranged between the liquid metals spreader and the heat sink.

Advantageously, in a first embodiment, the device according to the invention comprises:
  a first magnetic circuit comprising at least one bar made of a magnetic material and a permanent magnet;
  a first polymer frame;
  a first plate made of an insulating material on which semiconductor components are placed,
  a bar made of deformable material;
  three electrodes, one being placed on deformable material,
  a polymer seal with support means;
  a second plate made of an insulating material,
  a second polymer frame,
  a second magnetic circuit,
  a heat sink,
a liquid metal circulation channel being made around the bar made of deformable material.

Advantageously, in a second embodiment, the device according to the invention comprises:
  two first magnetic circuits,
  one polymer frame,
  a first ceramic plate on which semiconductor components are placed,
  a bar made of deformable material,
  electrodes, one of which is placed on deformable material,
  a polymer seal with support means,
  a second ceramic plate;
  two second magnetic circuits,
  a finned heat sink,
a liquid metal circulation channel being made around the bar made of deformable material.

Advantageously, in a third embodiment, the device according to the invention comprises:
  a first finned heat sink,
  a first polymer frame,
  first magnetic circuits,
  a first ceramic plate on which semiconductor components are placed;
  first electrodes,
  three first bars made of deformable material,
  a first polymer seal with support means,
  a second ceramic plate,
  a second polymer seal with support means,
  second electrodes,
  three second bars made of deformable material,
  a third ceramic plate,
  second magnetic circuits,
  a second polymer frame,
  a second finned heat sink,
a first liquid metal circulation channel being made around the first bars made of deformable material, and a second liquid metal circulation channel being made around the second bars made of deformable material.

The device according to the invention has the following advantages:
  the high conductivity of the spreader evacuates much higher heat flux densities than can be achieved with heat ducts. Values reaching about 1 $kW/cm^2$ are envisaged.
  The compactness of the spreader makes it possible to use a very small volume of liquid metal (a few millilitres). It also makes it possible to maintain the heat dissipation source close to the entire liquid volume so as to melt the liquid volume entirely. It is possible to restart after solidification.
  Melting may be desirable to use the phase change to reduce the rate of temperature rise of the electronic component(s). Thus, the use of alloys with a higher melting temperature and not containing gallium can be envisaged.

DETAILED PRESENTATION OF PARTICULAR EMBODIMENTS

Figure 1:
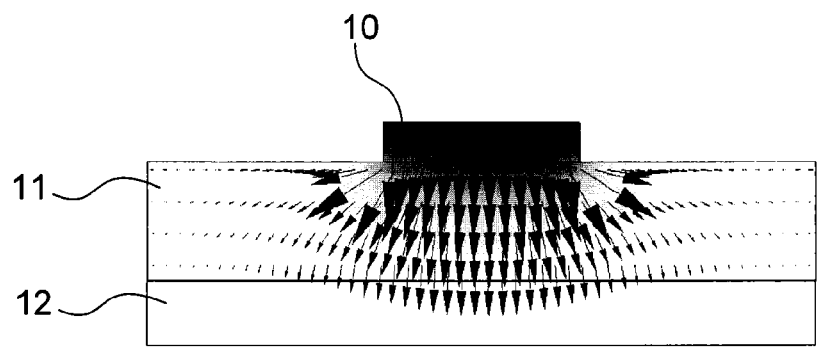
FIG. 1 shows the operating principle of a spreader type cooling device.
Figure 2:
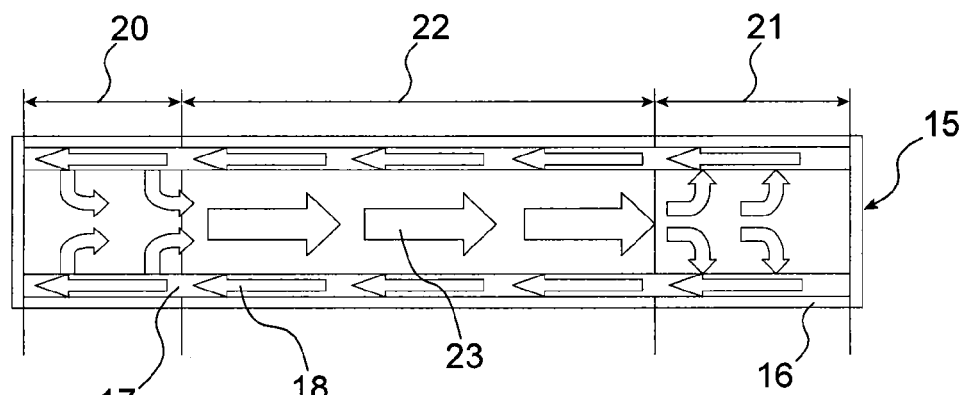
FIG. 2 shows the operating principle of a heat duct.
Figure 3:
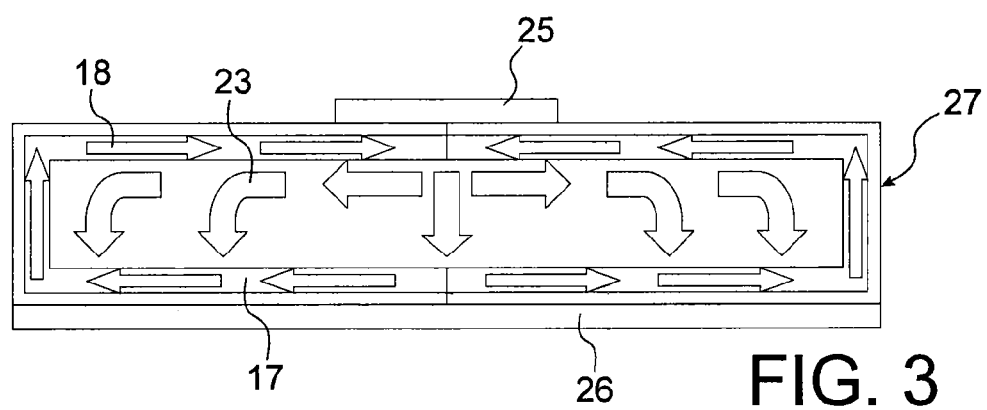
FIG. 3 shows the operating principle of a heat duct used as a heat spreader.
Figure 4:
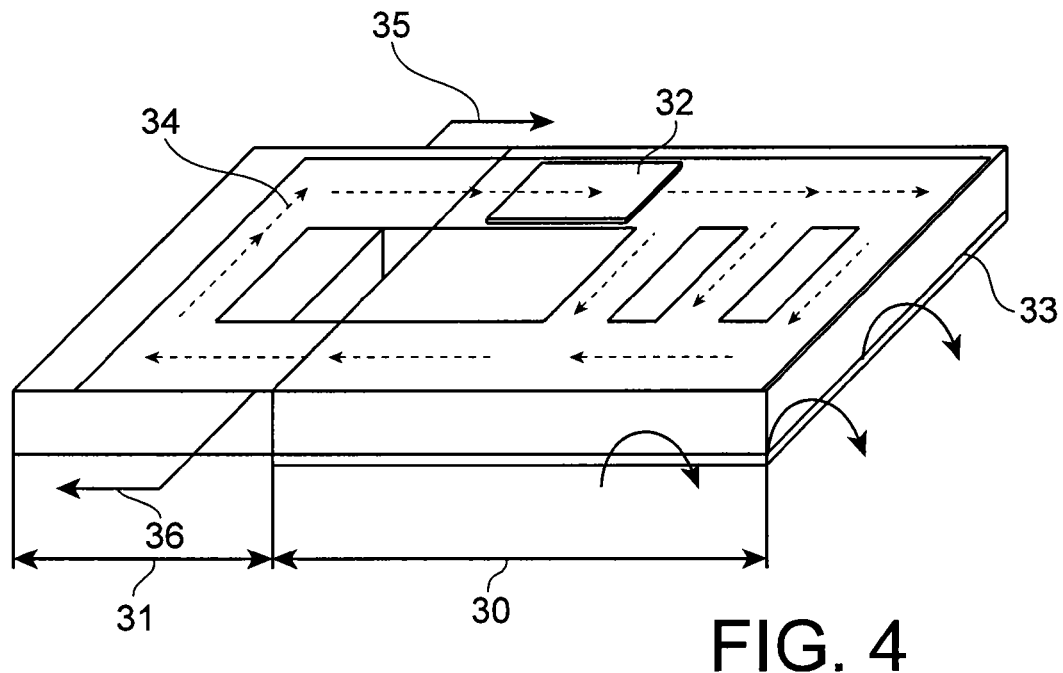
FIG. 4 shows the device according to the invention.

As shown in FIG. 4, the device according to the invention comprises the following elements:
- a heat dissipation source 32 that comprises at least one electronic component, for example a semiconductor component,
- a liquid metals spreader 30, that is the hydraulic part that evacuates heat below the heat dissipation source, made from two plates made of an insulating material, for example made of ceramic, arranged on each side of deformable material around which a liquid metal circulation channel is made;
- an electromagnetic pump 31 that keeps the liquid metal in movement;
- a heat sink 33.

The heat dissipation source 32 is arranged on the top face of the spreader 30. A heat sink 33 is arranged on the bottom face of the spreader 30. Reference 34 shows the liquid metal circulation in at least one channel, in which fins can be added to increase the exchange area. Reference 35 shows the liquid metal inlet and reference 36 shows the liquid metal outlet.

Figure 5:
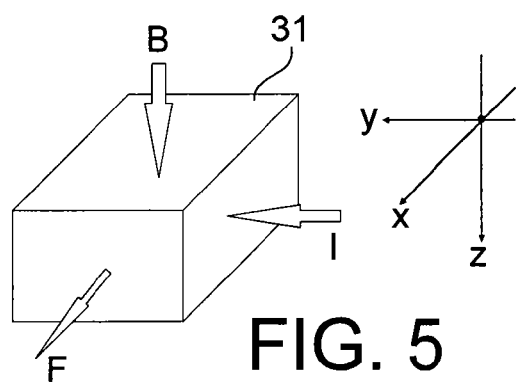
FIG. 5 shows the operating principle of an electromagnetic pump used in the device in FIG. 4.
Figure 7:
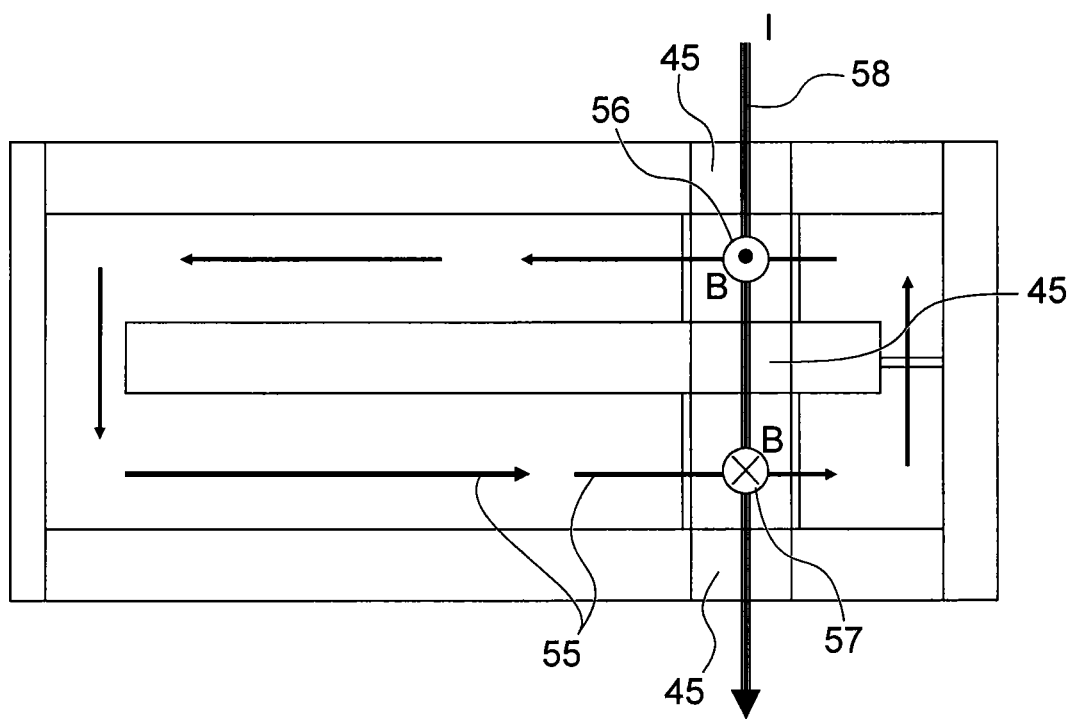
FIG. 7 diagrammatically shows the operation of an electromagnetic pump used in the device according to the invention shown in FIGS. 6A and 6B.

The device according to the invention circulates a liquid metal that is the heat transporting fluid, in a heat conducting substrate. This liquid metal absorbs heat under the electronic components 32 with small temperature rises and distributes this heat over the entire remaining surface of the substrate. Liquid metal such as gallium alloys or molten salts such as sodium-potassium, have excellent physical properties. Thus, gallium that has a thermal conductivity of approximately 28 $W \cdot m^{-1} K^{-1}$ which is 40 times greater than water, can achieve very high convective exchange coefficients and therefore very high dissipation in heat flux density. Apart from their high thermal conductivities, liquid metals also have the advantage that they are good electrical conductors, which makes it possible to use electromagnetic or magnetohydrodynamic pumps 31 as shown in FIGS. 5 and 7, in which the combined use of a magnetic field (magnetic induction B) and an electrical current I create a Laplace force F that drives movement of the liquid metal.

The invention can drive circulation of liquid metals inside a spreader made from a stack of at least two plates made of an insulating material chemically compatible with gallium, and a bar of deformable material that absorbs the expansion of gallium during its solidification. The electromagnetic pump that drives movement of the liquid metal may be integrated between the two plates. This liquid metal absorbs heat under the heat source with low temperature rises and distributes this heat over the entire remaining area of the spreader. The heat sink, that evacuates heat from the liquid metal, is transferred on a surface of the spreader.

Figure 6A:
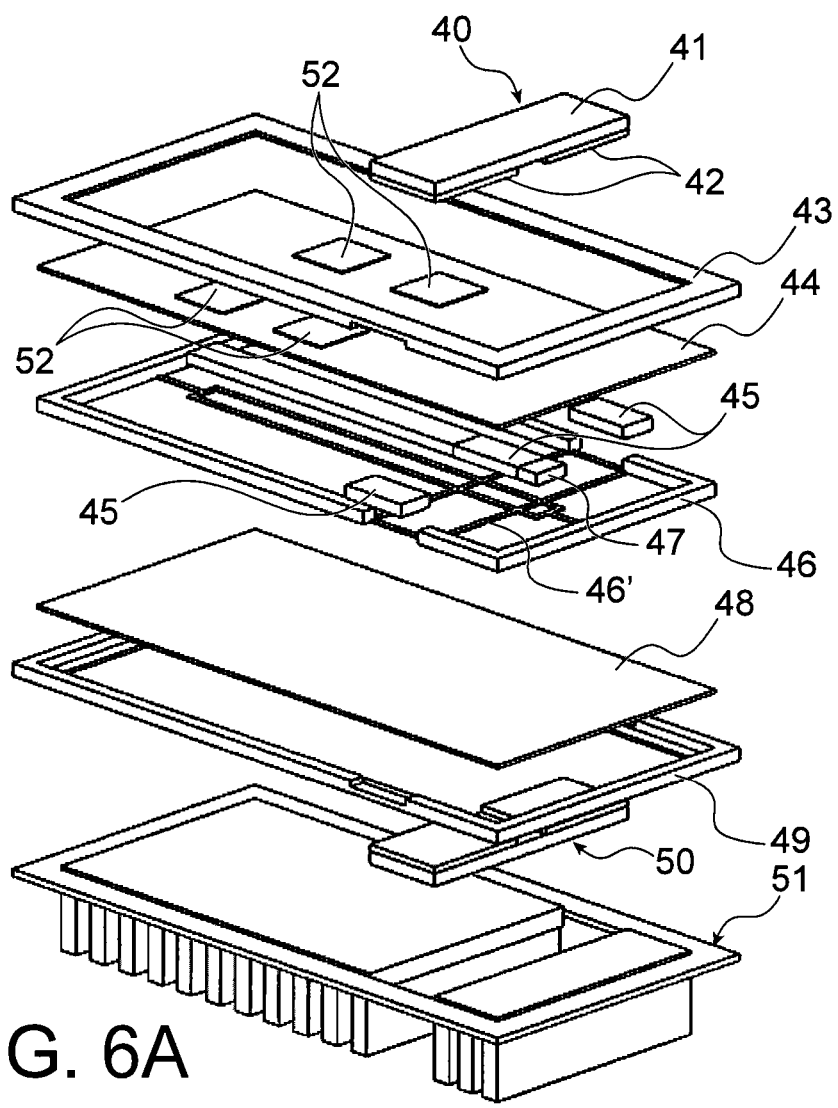
FIGS. 6A and 6B show an exploded view and a relief view respectively of a first embodiment of the device according to the invention.
Figure 6B:
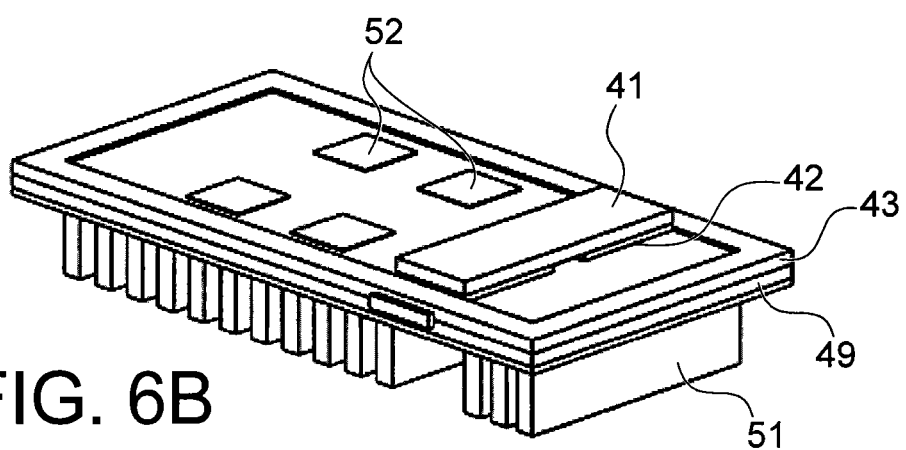

FIGS. 6A and 6B show a first embodiment of the device according to the invention comprising two electromagnetic pumps each comprising a first and a second electromagnetic circuit generating a magnetic field, and electrodes transporting electrical current.

FIG. 6A clearly shows the following:
- a first magnetic circuit 40 comprising at least one bar made of magnetic material 41 and a permanent magnet 42,
- a first polymer frame 43,
- a first plate made of an insulating material 44 on which semiconductor components 52 are located,
- a bar made of deformable material 47,
- three electrodes 45, one of which is arranged on deformable material,
- a polymer seal 46 with support means 46',
- a second plate made of insulating material 48,
- a second polymer frame 49,
- a second magnetic circuit 50,
- a heat sink 51, a liquid metal circulation channel being made around the bar made of deformable material 47.

In one advantageous embodiment, the device according to the invention has the following characteristics:

The liquid metal may be chosen from among gallium, indium, bismuth, tin, alloys containing gallium and/or indium and/or tin, sodium-potassium alloy.

The role of the polymer in the invention is to seal the spreader and to provide the stack with mechanical strength, the frames acting as a package for the device according to the invention. This polymer may be a resin. During assembly of the different elements shown in FIG. 6A, the polymer of the polymer frames 43, 46 and 49 is soft. It then solidifies when it is allowed to dry.

The bars made of deformable material may be made from expanded Teflon, foam with closed cells, foam with open cells with a sealed coating, or solid or hollow deformable plastic.

Advantageously, the two plates made of insulating material may be made from ceramic, AlN, Al2O3, $Si_3N_4$ or SiC that all respect the three following constraints: chemical compatibility with gallium, electrical insulation and good thermal conductivity.

The material from which electrodes are made, that must be an electrically conducting material and compatible with gallium, may be molybdenum, tungsten, stainless steel or copper coated with a protective layer.

The permanent magnets used to create the magnetic field in the channel may be made of NdFeB.

The heat sink may be a finned heat sink, associated or not with a fan, a cooler with forced liquid convection.

FIG. 7 shows operation of an electromagnetic pump. It is formed from the first magnetic circuit 40 and the second magnetic circuit 50 and electrodes 45, the liquid metal circulation channel being formed around the bar made of deformable material 52. The arrow 58 indicates the direction of the electrical current passing through the electrodes. The arrows 56 and 57 give the direction of magnetic induction B formed between the two magnetic circuits 40 and 50. The arrows 55 show the resulting direction of displacement of the liquid metal, in accordance with the principle described above with reference to FIG. 5.

Figure 8A:
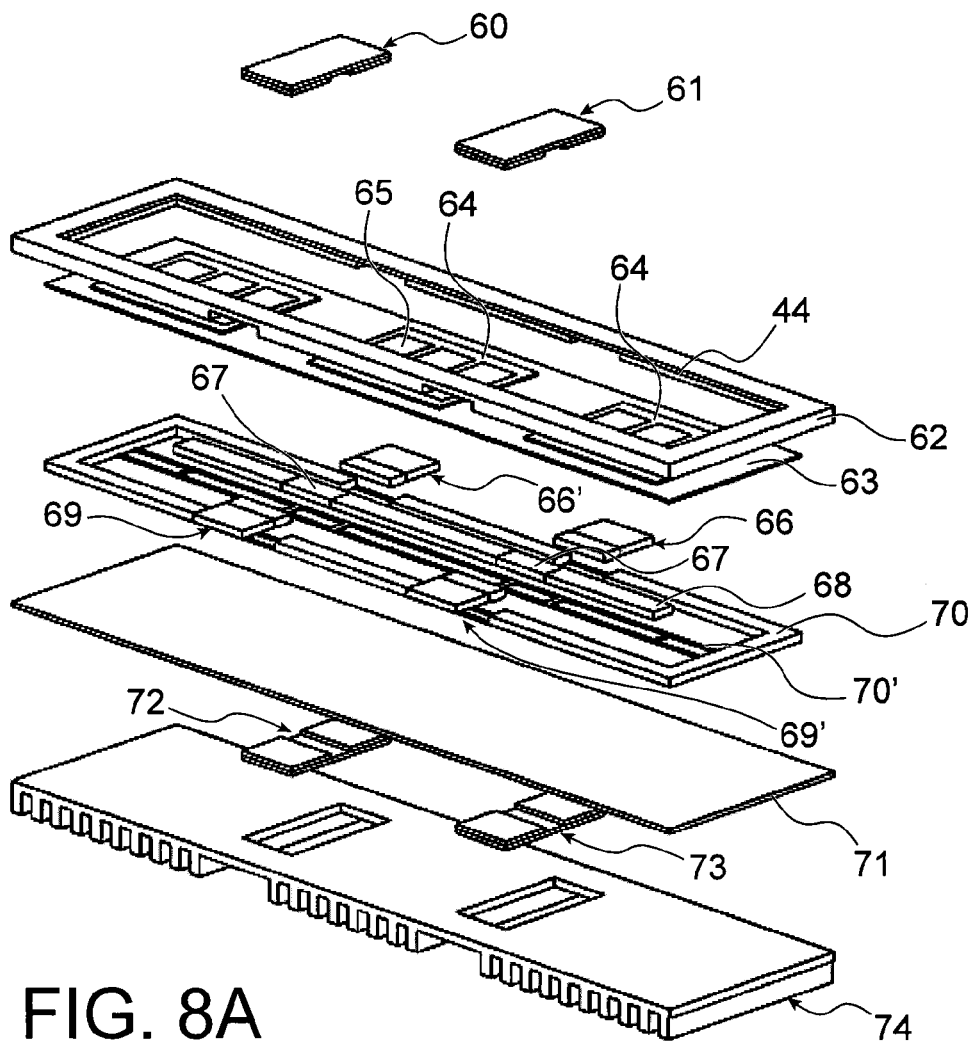
FIGS. 8A and 8B show a second embodiment of the device according to the invention in an exploded view and in a relief view respectively.
Figure 8B:
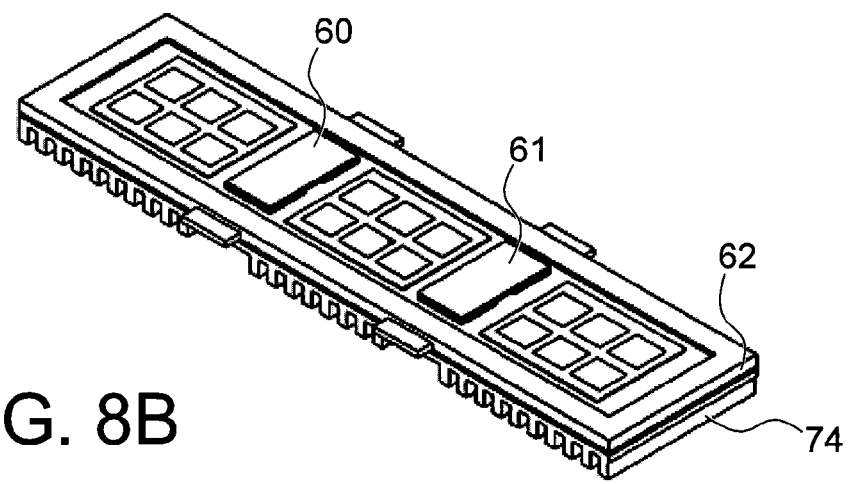

FIGS. 8A and 8B show a second embodiment of the device according to the invention, that corresponds to a power model comprising four electromagnetic pumps.

FIG. 8A clearly shows the following:
- two first magnetic circuits 60 and 61,
- a polymer frame 62,
- a first ceramic plate 63, on which electronic circuits 64 or several electronic components 65 are placed,
- a bar made of deformable material 68, electrodes 66, 66', 69, 69' and electrodes 67 placed on deformable material 68,
a polymer seal 70 with support means 70',
a second ceramic plate 71,
two second magnetic circuits 72 and 73,
a finned heat sink 74,
a liquid metal circulation channel being made around the bar made of deformable material 68.

Figure 9A:
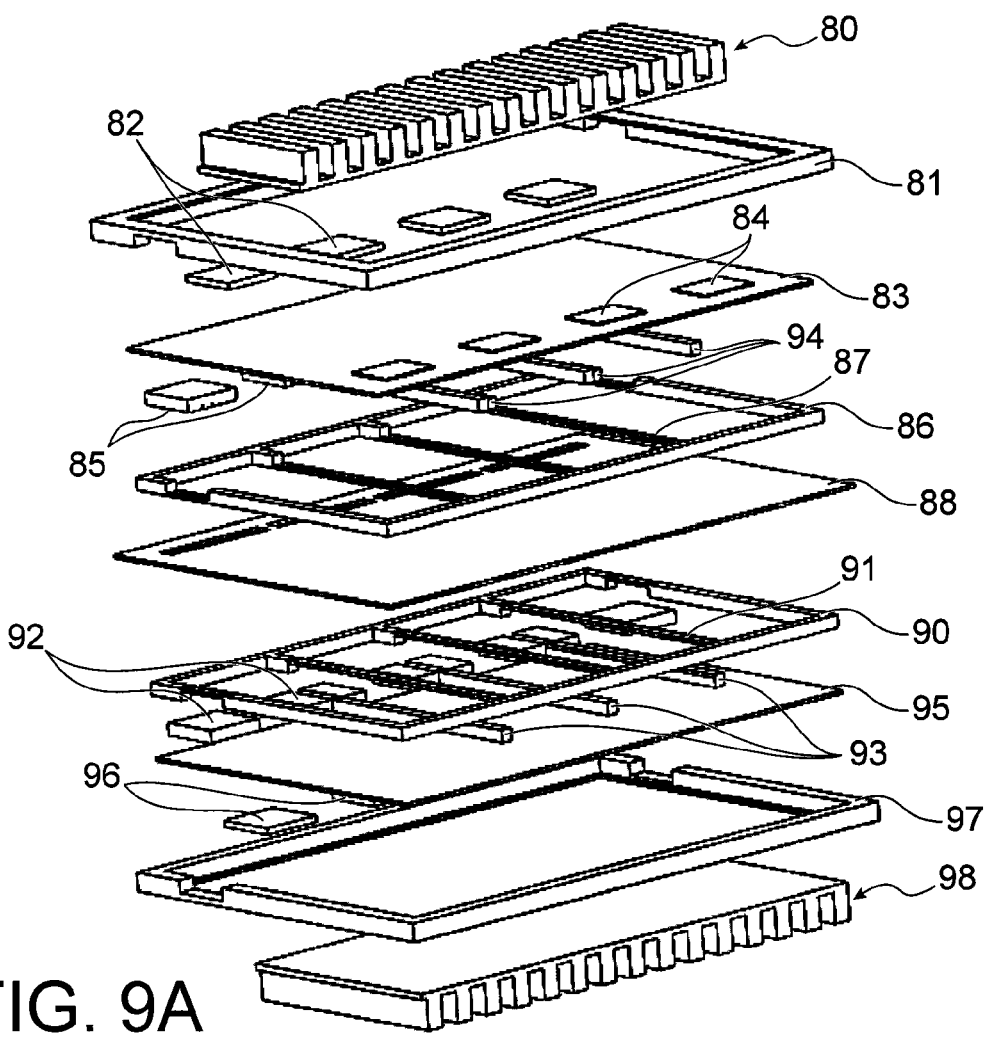
FIGS. 9A and 9B show an exploded view and a relief view respectively of a third embodiment of the device according to the invention.
Figure 9B:
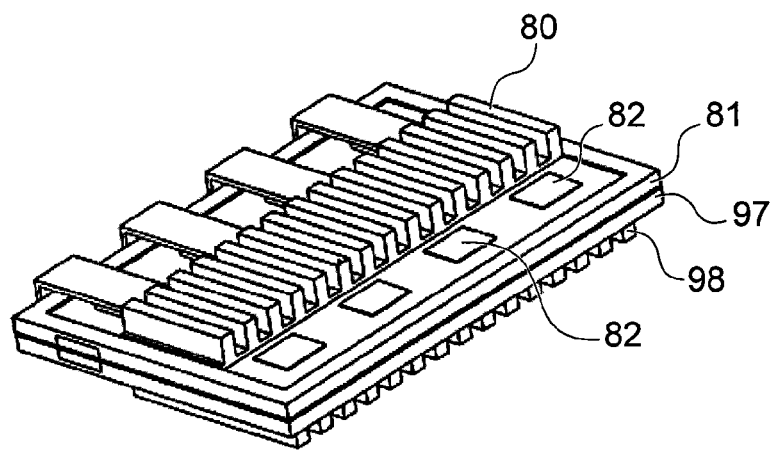

FIGS. 9A and 9B show a third embodiment of the device according to the invention, that corresponds to a model with two superposed liquid metal circulation channels.

FIG. 9A clearly shows the following:
a first finned heat sink 80,
a first polymer frame 81,
first magnetic circuits 82,
a first ceramic plate 83 on which semiconductor components 84 are located,
first electrodes 85,
three first bars made of deformable material 94,
a first polymer seal 86, with support means 87,
a second ceramic plate 88,
a second polymer seal 90 with support means 91,
second electrodes 92,
three second bars made of deformable material 93,
a third ceramic plate 95,
second magnetic circuits 96,
a second polymer frame 97,
a second finned heat sink 98,
a first liquid metal circulation channel being made around first bars made of deformable material 92, and a second liquid metal circulation channel being made around second bars made of deformable material 93.

Figure 10A:
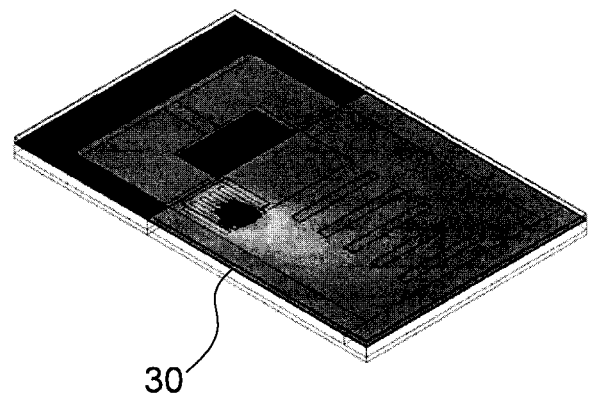
Figure 10B:
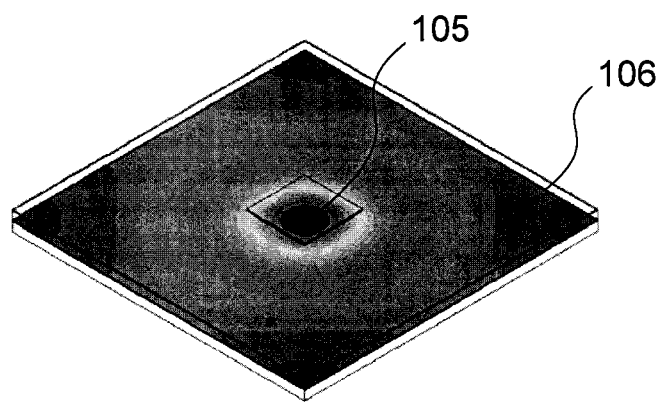
Figure 11:
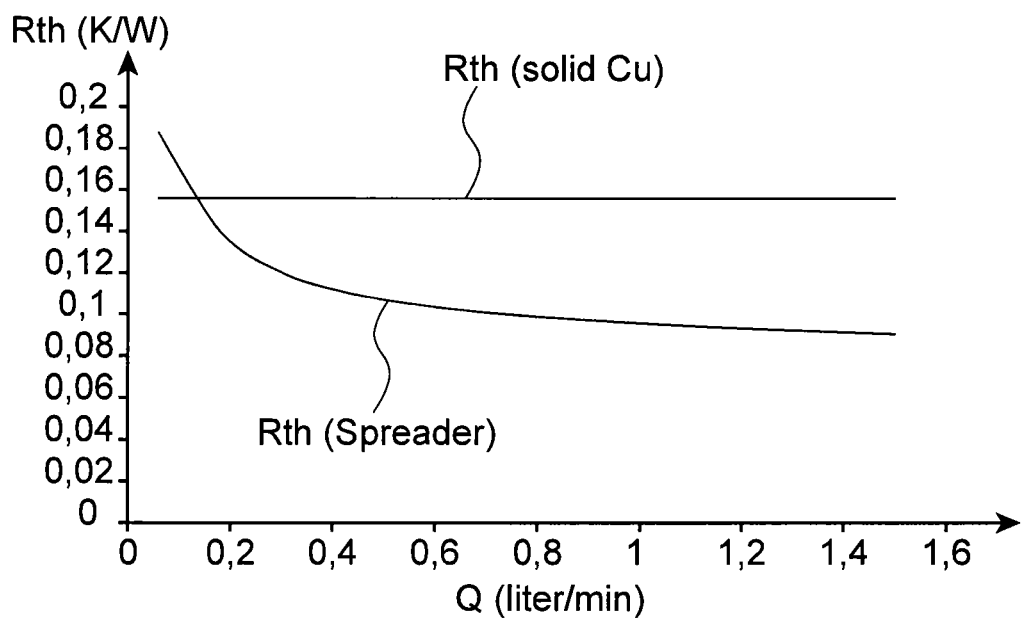
FIG. 11 shows compared performances of a liquid metals spreader according to the invention shown in FIG. 10A and a copper spreader shown in FIG. 10B.

In order to demonstrate the advantages of a spreader as described above, its performances can be compared with the performances of a solid copper block with the same volume. The value of the exchange coefficient imposed on the surface opposite the electronic component is the same in both types of spreader, $h=20000$ $W \cdot m^{-2} \cdot K^{-1}$. FIG. 10A thus shows a liquid metals spreader 30 according to the invention (see FIG. 4) and FIG. 10B shows a spreader formed from a copper block. In the latter case, the dissipation source 105 is at the centre of spreader 106 because this configuration gives the lowest possible thermal resistance. FIG. 11 shows the variation of the thermal resistance Rth of these two types of spreader as a function of the liquid metal flow. The thermal resistance of the solid copper spreader is constant and is equal to the value 0.16 K·W−1, on the other hand the thermal resistance of the liquid metals spreader for a flow of 1.5 1/min, is 0.09 K·W−1, which is a 45% reduction.

Variant Embodiments

The invention may be used in different fields such as microelectronics, particularly for cooling of microprocessors, power electronics, for cooling semiconductor components, optoelectronic components, for cooling LEDs, or for solar energy, for concentration photovoltaic cells.

Figure 12A:
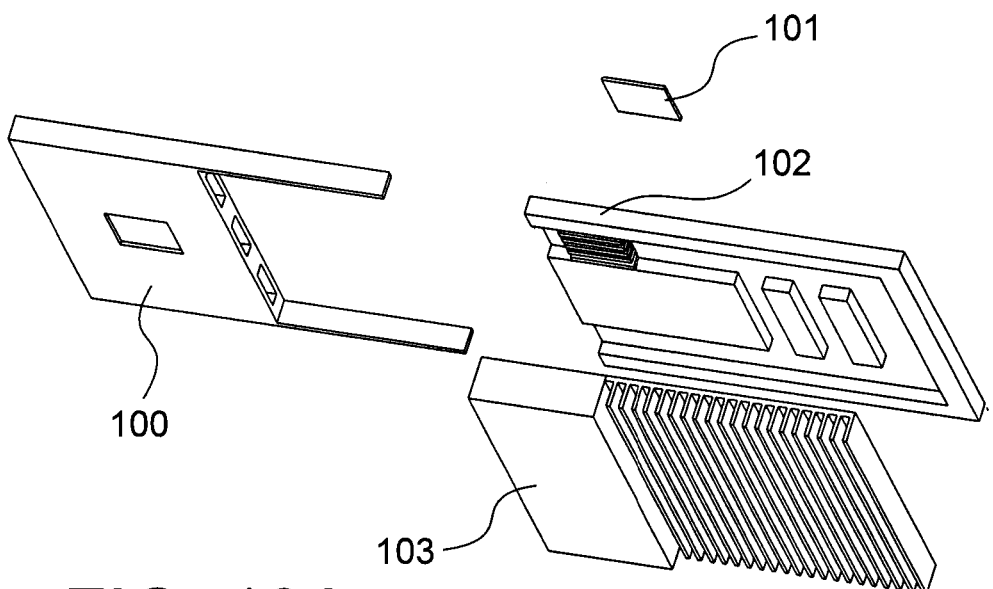
FIGS. 12A and 12B show a variant embodiment of the device according to the invention.
Figure 12B:
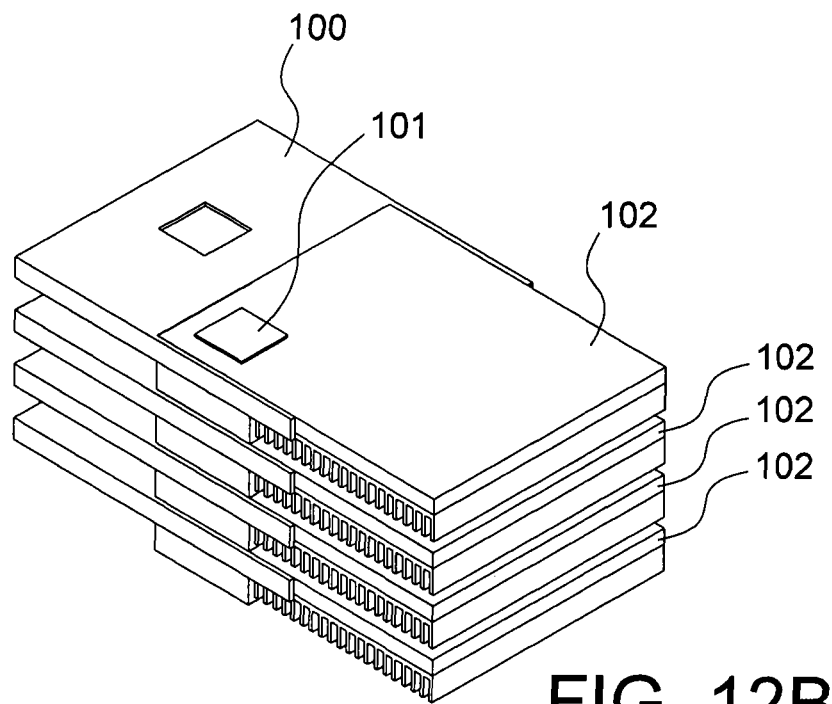

FIGS. 12A and 12B show a variant embodiment of the device according to the invention using stacks made of several semiconductor components installed vertically (3D power module) 101/liquid metals spreader 102/heat sink 103, each associated with an electromagnetic pump 100.

Figure 13:
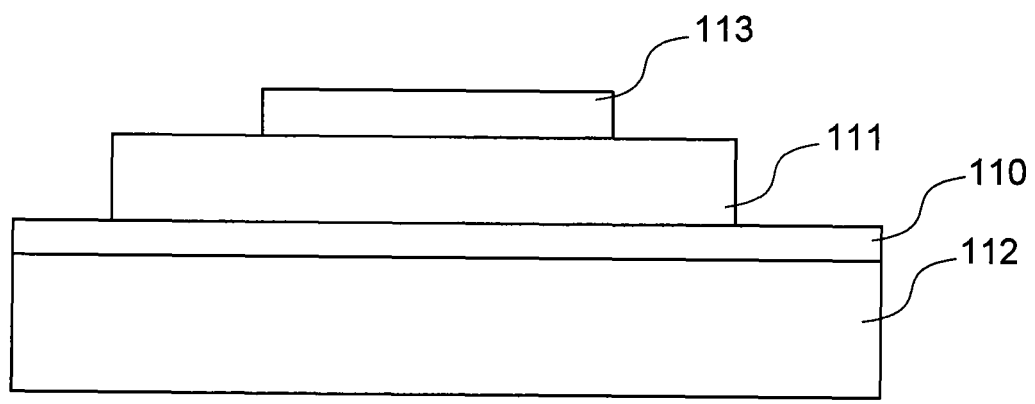
FIG. 13 shows another variant embodiment of the device according to the invention.

In another variant embodiment shown in FIG. 13, a heat duct 110 may be added between the liquid metals spreader 111 and the heat sink 112, to make the spreader temperature uniform and further increase its performances. In this case, the phase change of the liquid metal inside the spreader is better. Furthermore, introduction of the liquid metals spreader 111 between the dissipation source 113, that is a semiconductor component, and the heat duct reduces the heat density experienced by the heat duct and thus takes it further from its operating limits (capillary limit and boiling limit in particular).

In one variant embodiment, the spreader has fins inside the liquid metal circulation channel to increase the exchange area with the liquid metal, as shown for example in FIGS. 10A and 12A.

REFERENCES

[1] Miner, A. & Ghoshal, U., 2004. Cooling of high-power-density microdevices using liquid metal coolants. Applied Physics Letters, 85(3), 506.
[2] U.S. 2009/0279257.

The invention claimed is:

1. An electronic device for cooling of a heat dissipation source by a liquid metals spreader, the electronic device comprising:
at least one heat dissipation source comprising at least one electronic component;
at least one spreader through which at least one liquid metal circulation channel passes forming a loop routed below the heat dissipation source;
at least one heat sink; and
at least one electromagnetic pump moving the liquid metal in the at least one channel such that the liquid metal absorbs heat dissipated by the heat dissipation source and transports the absorbed heat to be evacuated by the heat sink,
wherein each spreader comprises at least two plates made of an insulating material located on each side of at least one bar made of deformable material, around which the liquid metal circulation channel is made.

2. An electronic device according to claim 1, wherein the at least electronic component is a semiconductor component.

3. An electronic device according to claim 2, comprising stacks made of several semiconductor components/liquid metals spreader/heat sink, each associated with an electromagnetic pump.

4. An electronic device according to claim 1, wherein the liquid metal is chosen from among gallium, indium, bismuth, tin, alloys including gallium and/or indium and/or tin, sodium-potassium alloy.

5. An electronic device according to claim 1, wherein each bar made of deformable material is made from expanded Teflon, foam with closed cells, foam with open cells and with sealed coating, or solid or hollow deformable plastic.

6. An electronic device according to claim 1, wherein the heat sink is a finned heat sink or a forced convection liquid cooler.

7. An electronic device according to claim 6, wherein the finned heat sink is used with a fan.

8. An electronic device according to claim 1, wherein each electromagnetic pump is a magnetohydrodynamic conducting pump.

9. An electronic device according to claim 1, wherein the plates made of an insulating electrical material are made of ceramic, AlN, Al2O3, $Si_3N_4$, or SiC.

10. An electronic device according to claim 1, wherein each electromagnetic pump is included between the two plates of a spreader made of an insulating material.

11. An electronic device according to claim 1, wherein the spreader comprises fins inside the at least one liquid metal circulation channel to increase an exchange area with the liquid metal.

12. An electronic device according to claim 1, further comprising a heat duct arranged between the liquid metals spreader and the heat sink.

13. An electronic device according to claim 1, further comprising:
a first polymer frame;
a polymer seal with support means;
a second polymer frame;
a first plate made of an insulating material on which semiconductor components are placed, the first plate being arranged between the first polymer frame and the polymer seal;
a second plate made of an insulating material, the second plate being arranged between the polymer seal and the second polymer frame;
a bar made of deformable material, the bar made of deformable material being arranged between the first plate and the second plate;
three electrodes one being placed on the bar made of deformable material;
a first magnetic circuit comprising at least one bar made of a magnetic material and a permanent magnet, the first magnetic circuit being placed on a side of the first plate opposite to the polymer seal;
a second magnetic circuit, the second magnetic circuit being placed on a side of the second plate opposite to the polymer seal;
a heat sink, the heat sink being placed on the side of the second plate opposite to the polymer seal;
the liquid metal circulation channel being made around the bar made of deformable material.

14. An electronic device according to claim 13, wherein the electrodes are made from copper coated with a protective layer, molybdenum, tungsten, or stainless steel.

15. An electronic device according to claim 1, further comprising:
one polymer frame;
electrodes one of which i3 placed on deformable material;
a polymer seal with support means;
a finned heat sink;
a first ceramic plate on which plural semiconductor components are placed, the first ceramic plate being arranged between the polymer frame and the polymer seal;
a second ceramic plate, the second ceramic plate being arranged between the polymer seal and the finned heat sink;
two first magnetic circuits, the two first magnetic circuits being placed on a side of the first ceramic plate opposite to the polymer seal;
a bar made of deformable material, the bar made of deformable material being arranged between the first ceramic plate and the second ceramic plate;
electrodes, one of which is placed on deformable material;
two second magnetic circuits, the two second magnetic circuits being placed on a side of the second ceramic plate opposite to the polymer seal;
the liquid metal circulation channel being made around the bar made of deformable material.

16. An electronic device according to claim 1, further comprising:
a first polymer frame;
a first polymer seal with support means;
a second polymer seal with support means;
a second polymer frame;
a first ceramic plate on which semiconductor components are placed, the first ceramic plate being arranged between the first polymer frame and the first polymer seal;
a second ceramic plate, the second ceramic plate being arranged between the first polymer seal and the second polymer seal;
a third ceramic plate, the third ceramic plate being arranged between the second polymer seal and the second polymer frame;
a first finned heat sink, the first finned heat sink being placed on a side of the first ceramic plate opposite to the first polymer seal;
first magnetic circuits, the first magnetic circuits being placed on the side of the first ceramic plate opposite to the first polymer seal;
first electrodes, the first electrodes being arranged between the first ceramic plate and the second ceramic plate;
three first bars made of deformable material, the three first bars made of deformable material being arranged between the first ceramic plate and the second ceramic plate;
second electrodes, the second electrodes being arranged between the second ceramic plate and the third ceramic plate;
three second bars made of deformable material, the three second bars made of deformable material being arranged between the second ceramic plate and the third ceramic plate;
second magnetic circuits, the second magnetic circuits being placed on a side of the third ceramic plate opposite to the second polymer seal;
a second finned heat sink, the second finned heat sink being placed on the side of the third ceramic plate opposite to the second polymer seal;
a first liquid metal circulation channel being made around the first bars made of deformable material, and a second liquid metal circulation channel being made around the second bars made of deformable material.

* * * * *